US008289789B2

(12) United States Patent
Nara

(10) Patent No.: US 8,289,789 B2
(45) Date of Patent: Oct. 16, 2012

(54) SEMICONDUCTOR DEVICE AND SEMICONDUCTOR MODULE

(75) Inventor: Masaru Nara, Chuo-ku (JP)

(73) Assignee: Elpida Memory, Inc., Tokyo (JP)

( * ) Notice: Subject to any disclaimer, the term of this patent is extended or adjusted under 35 U.S.C. 154(b) by 79 days.

(21) Appl. No.: 13/021,391

(22) Filed: Feb. 4, 2011

(65) Prior Publication Data

US 2011/0194359 A1   Aug. 11, 2011

(30) Foreign Application Priority Data

Feb. 8, 2010   (JP) ................................. 2010-025517

(51) Int. Cl.
*G11C 7/00* (2006.01)
(52) U.S. Cl. .................................... 365/193; 365/233.1
(58) Field of Classification Search .................. 365/193, 365/191, 233.1
See application file for complete search history.

(56) References Cited

U.S. PATENT DOCUMENTS 6,785,189 B2 * 8/2004 Jacobs et al. ............. 365/233.13
7,768,867 B2 * 8/2010 Nishio et al. ............... 365/233.1
7,876,630 B1 * 1/2011 Clarke et al. .................. 365/193
2006/0203573 A1 * 9/2006 Kim et al. ..................... 365/193

FOREIGN PATENT DOCUMENTS

| JP | 09-330589 A | 12/1997 |
| JP | 11-339473 A | 12/1999 |
| JP | 2006-024663 A | 1/2006 |
| JP | 2008-130184 A | 6/2008 |

\* cited by examiner

*Primary Examiner* — Anh Phung
(74) *Attorney, Agent, or Firm* — Sughrue Mion, PLLC

(57) ABSTRACT

A semiconductor device according to the present invention performs, when a first word structure is designated, control such that input and output of data is performed from a first data input/output terminal and from a second data input/output terminal in response to a first strobe signal and a second strobe signal. The semiconductor device performs, when a second word structure is designated and when a first control signal is supplied, control such that input and output of data is performed from the first data input/output terminal in response to the first strobe signal. The semiconductor device performs, when the second word structure is designated and when a second control signal is supplied, control such that input and output of data is performed from the second data input/output terminal in response to the second strobe signal.

6 Claims, 6 Drawing Sheets

SEMICONDUCTOR DEVICE AND SEMICONDUCTOR MODULE

BACKGROUND OF THE INVENTION

1. Field of the Invention

The present invention relates to a semiconductor device and a semiconductor module mounted with the semiconductor device.

2. Description of Related Art

In recent years, ASIC (Application Specific Integrated Circuit) and DRAM (Dynamic Random Access Memory) are used on the inside of digital home electronic appliances in order to perform various information processing and control operations.

The ASIC and the DRAM are mainly connected in a one-to-one ratio. However, according to diversification of information processing and complication of control, there is a demand for an increase in the memory capacity of the DRAM in the same package (PKG). Therefore, in recent years, as shown in FIG. 1A, ASIC and DRAMs are connected in a one-to-two ratio. The ASIC is actuated to selectively control the DRAMs using a chip selection signal.

However, when the number of DRAMs connected to a transmission line of the ASIC increases, reflected waves (noise) generated from contacts with the transmission line in the DRAMs increase and the load on the transmission line also increases. This makes it difficult to design the ASIC and the DRAMs.

Specifically, when the DRAMs perform operations at a DDR (Double data rate), the DRAMs read and write data at both a rising edge and a falling edge of a reference clock. Therefore, a DQ signal (a data signal) operates at speed twice as high as that of other signals. The DQ signal particularly tends to be affected by noise. Similarly, a DQS signal (a data strobe signal) as a reference clock of the DQ signal is also present in the DRAMs after introduction of the DDR. Since the DQS signal operates at the same speed in association with the DQ signal, the DQS signal also tends to be affected by noise like the DQ signal.

Therefore, at least a DQ pin on the ASIC side and a DQ pin on the DRAM side are connected in a one-to-one ratio and a DQS pin on the ASIC side and a DQS pin on the DRAM side are connected in a one-to-one ratio as shown in FIG. 1B.

A semiconductor module having a simplex PKG structure in which only one DRAM is mounted on a PKG substrate is shown in FIG. 2A. In FIG. 2A, the DRAM has sixteen DQ pins and performs ×16 operation for inputting and outputting a 16-bit DQ signal. Pads on the DRAM and pads on the PKG substrate are connected in a one-to-one ratio. External pins drawn out from the PKG substrate to the outside and connected to an ASIC are represented by circles.

There is a semiconductor module having a structure in which plural DRAMs are mounted on a PKG substrate in order to increase the memory capacity of a DRAM while maintaining a connection state of the simplex PKG structure shown in FIG. 2A, i.e., the arrangement of the external pins (JP2006-024663A, JP2008-130184A, JP09-330589A, and JP11-339473A).

Among the semiconductor modules disclosed in these patent documents, an example of a semiconductor module having a structure called DDP (Double Density Package) in which two DRAM chips are stacked on a PKG substrate is shown in FIG. 2B.

In such a semiconductor module having the DDP structure, two DRAM chips that perform ×8 operation are actuated, whereby a package performs ×16 operation. Specifically, the package including one 1 GB DRAM chip that performs the ×16 operation is changed to two 1 GB DRAM chips that perform that ×8 operation. Consequently, the package can be changed to a 2 GB package that performs the ×16 operation.

In this case, as regards the DRAMs, it is costly to separately manufacture the ×8 operation chips and the ×16 operation chips. Therefore, a general-purpose DRAM that can switch the ×8 operation and ×16 operations is used to switch the operation state of the upper and lower DRAMs from ×16 operation state to ×8 operation state according to a bonding option or the like.

When the upper and lower DRAMs are caused to perform the ×8 operation, in order to realize a one-to-one connection of pads on the DRAMs and pads on the PKG substrate, concerning a DQ signal, DQ0~DQ15 pads on the upper DRAM are alternately enabled (DQ0, DQ2, DQ4, DQ6, DQ8, DQ10, DQ12, and DQ14) and respectively connected to DQ0, DQ2, DQ4, DQ6, DQ8, DQ10, DQ12, and DQ14 pads on the PKG substrate. DQ0~DQ15 pads on the lower DRAM are alternately enabled (DQ0, DQ2, DQ4, DQ6, DQ8, DQ10, DQ12, and DQ14) and respectively connected to DQ1, DQ3, DQ5, DQ7, DQ9, DQ11, DQ13, and DQ15 pads on the PKG substrate.

On the other hand, concerning a DQS signal, in the case of the ×8 operation, both the upper and lower DRAMs use DQS0 pads. Therefore, it is necessary to connect the DQS0 pads on the upper and lower DRAMs to a DQS0 pad on the PKG substrate. Since the PKG substrate is common to the upper and lower DRAMs, in order to connect the DQS signal without changing the external pin arrangement, one DQS0 pad on the PKG substrate has to be connected to the DQS0 pads of the upper and lower two DRAMs. Therefore, as a result, the PKG substrate and the DRAMs are connected in a one-to-two ratio. Therefore, only the DQS0 pad on the lower DRAM is connected to the DQS0 pad on the PKG substrate and the DQS0 pad on the upper DRAM is finally connected to a DQS1 pin (an external pin) by extending a wire on the PKG substrate. Consequently, a one-to-one connection can be realized.

However, as it is evident from FIG. 2B, although the positions of the DQS0 pad and a DQS1 pad are the same on the upper and lower DRAMs, the DQS0 pad and the DQS1 pad are arranged in positions apart from each other on the PKG substrate.

Therefore, concerning the DQS0 pad on the upper DRAM, after the DQS0 pad is connected to pad 1 provided on the PKG substrate anew, wire 2 from new pad 1 has to be extended to the DQS1 pin (the external pin). However, in this case, the inventor recognized that, in the upper DRAM, a signal path between the DRAM and the PKG substrate does not have substantially equal lengths for the DQ signal and the DQS signal of DQS0.

SUMMARY

In one embodiment, there is provided a semiconductor device that includes:

a first data input/output terminal;

a second data input/output terminal;

a first strobe terminal that is provided to correspond to the first data input/output terminal and to which a first strobe signal is supplied;

a second strobe terminal that is provided to correspond to the second data input/output terminal and to which a second strobe signal is supplied; and a control circuit that performs, when a first word structure is designated, control such that input and output of data is performed from the first data input/output terminal and from the second data input/output terminal in response to the first strobe signal and the second strobe signal, performs, when a second word structure is designated and when a first control signal is supplied, control such that input and output of data is performed from the first data input/output terminal in response to the first strobe signal, and performs, when the second word structure is designated and when a second control signal is supplied, control such that input and output of data is performed from the second data input/output terminal in response to the second strobe signal.

In another embodiment, there is provided a semiconductor module that includes:

a substrate; and two semiconductor devices that are stacked on the substrate and that input and output a DQ signal according to a DQS signal, wherein the substrate includes:

N (N is an even natural number) DQ pins to which the DQ signal is input and from which the DQ signal is output; and first and second DQS pins to which the DQS signal is input, and each of the two semiconductor devices includes:

a word structure designation terminal to which a word structure designation signal for instructing switching from ×N operation to ×M (M=N/2) operation is input;

a DQ/DQS signal input terminal to which a DQ/DQS switching signal that indicates, as a DQ pin to which the DQ signal is input and from which the DQ signal is output during the ×M operation, an ordinally even-numbered DQ pin or an ordinally odd-numbered DQ pin among the N DQ pins;

N DQ control circuits that are provided to correspond to the N DQ pins and, when the DQS signal is supplied via the first or second DQS pin, input and output the DQ signal via a DQ pin corresponding to the DQS pin according to the supplied DQS signal;

a first DQS control circuit that is provided to correspond to the first DQS pin and, when the DQ/DQS switching signal indicates the ordinally even-numbered DQ pin during the ×M operation, supplies the DQS signal, supplied to the first DQS pin, to the DQ control circuit corresponding to the ordinally even-numbered DQ pin; and a second DQS control circuit that is provided to correspond to the second DQS pin and, when the DQ/DQS switching signal indicates the ordinally odd-numbered DQ pin during the ×M operation, supplies the DQS signal, supplied to the second DQS pin, to the DQ control circuit corresponding to the ordinally odd-numbered DQ pin.

The semiconductor device according to the present invention includes the control circuit that performs, when the first word structure is designated, control such that input and output of data is performed from the first data input/output terminal and from the second data input/output terminal in response to the first strobe signal and the second strobe signal, performs, when the second word structure is designated and the first control signal is supplied, control such that input and output of data is performed from the first data input/output terminal in response to the first strobe signal, and performs, when the second word structure is designated and when the second control signal is supplied, control such that input and output of data is performed from the second data input/output terminal in response to the second strobe signal.

Therefore, in the semiconductor module mounted with a pair of such semiconductor devices in upper and lower parts thereof, it is possible to cause one semiconductor device to perform an operation for inputting data to and outputting data from the first data input/output terminal in response to the first strobe signal and to cause the other semiconductor device to perform an operation for inputting data to and outputting data from the second data input/output terminal in response to the second strobe signal.

Therefore, unlike the related art, since both the upper and lower semiconductor devices do not need to use the same DQS pad (the DQS0 pad shown in FIG. 2B), it is unnecessary to extend the wire on the substrate.

Consequently, there is an effect in which, in both the upper and lower semiconductor devices, the signal paths between the semiconductor devices and the substrate can be set to substantially equal lengths for a data signal and a strobe signal.

BRIEF DESCRIPTION OF THE DRAWINGS

The above features and advantages of the present invention will be more apparent from the following description of certain preferred embodiments taken in conjunction with the accompanying drawings, in which.

DETAILED DESCRIPTION OF THE PREFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purposes.

A semiconductor module according to an exemplary embodiment of the present invention is explained as having a DDP structure in which two DRAM chips as semiconductor devices, are stacked on a PKG substrate, including sixteen DQ pins for each of the DRAMs, and which is capable of switching ×8 operation and ×16 operation.

Figure 1A:
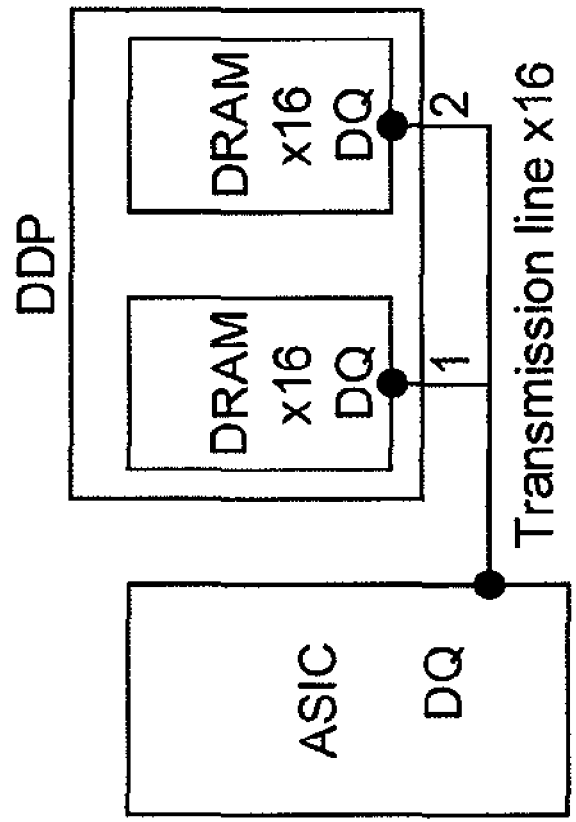
FIG. 1A is a diagram showing a connection configuration of DRAMs and an ASIC mounted on a related semiconductor module having a DDP structure.
Figure 1B:
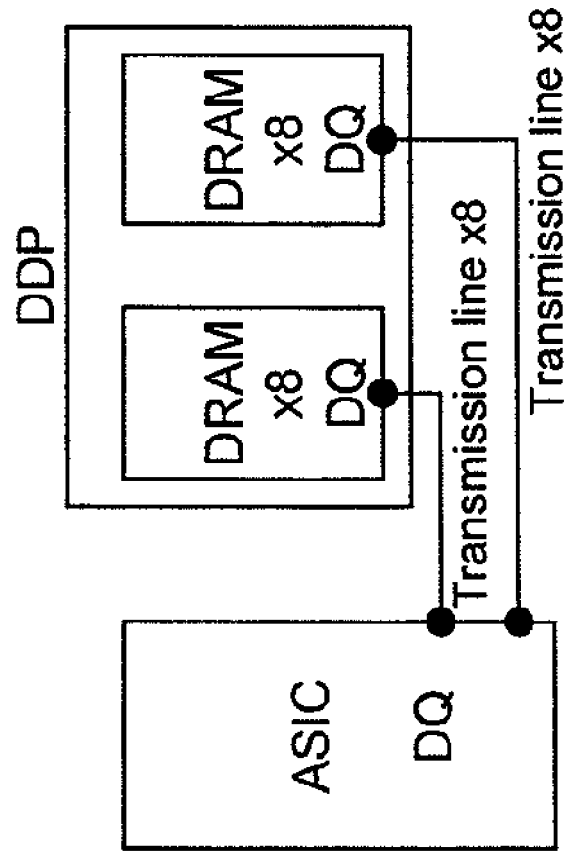
FIG. 1B is a diagram showing a connection configuration of DRAMs and an ASIC mounted on a related semiconductor module having the DDP structure.
Figure 2A:
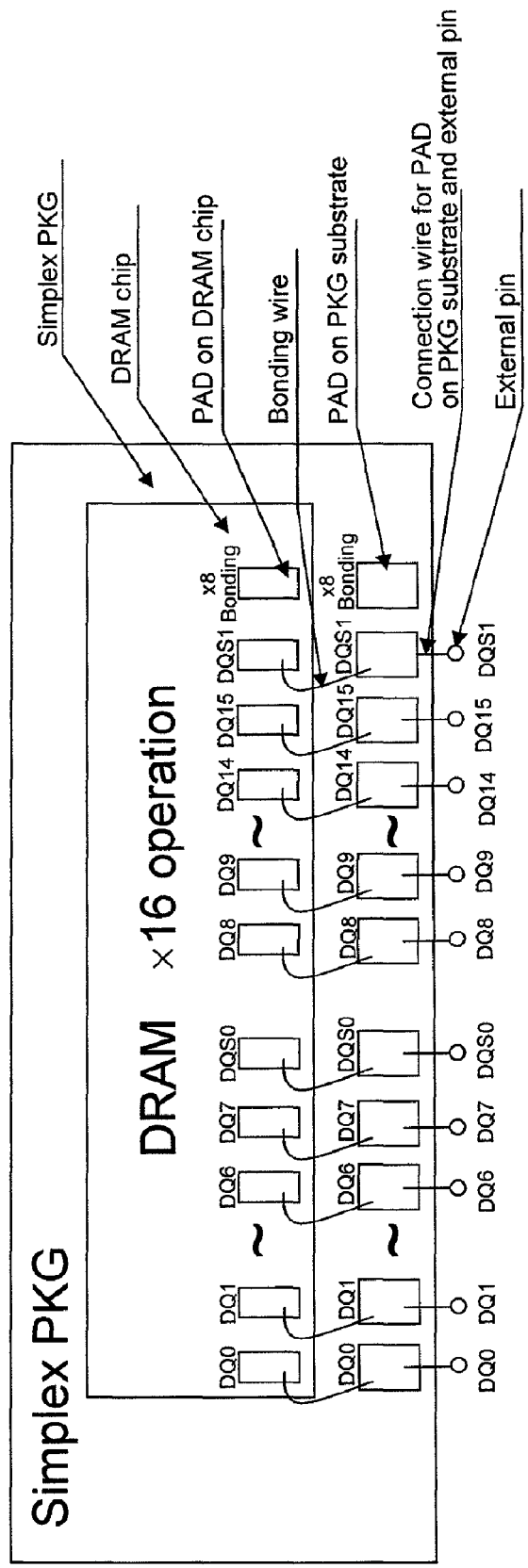
FIG. 2A is a diagram showing a bonding configuration of a related semiconductor module having a simplex PKG structure.
Figure 2B:
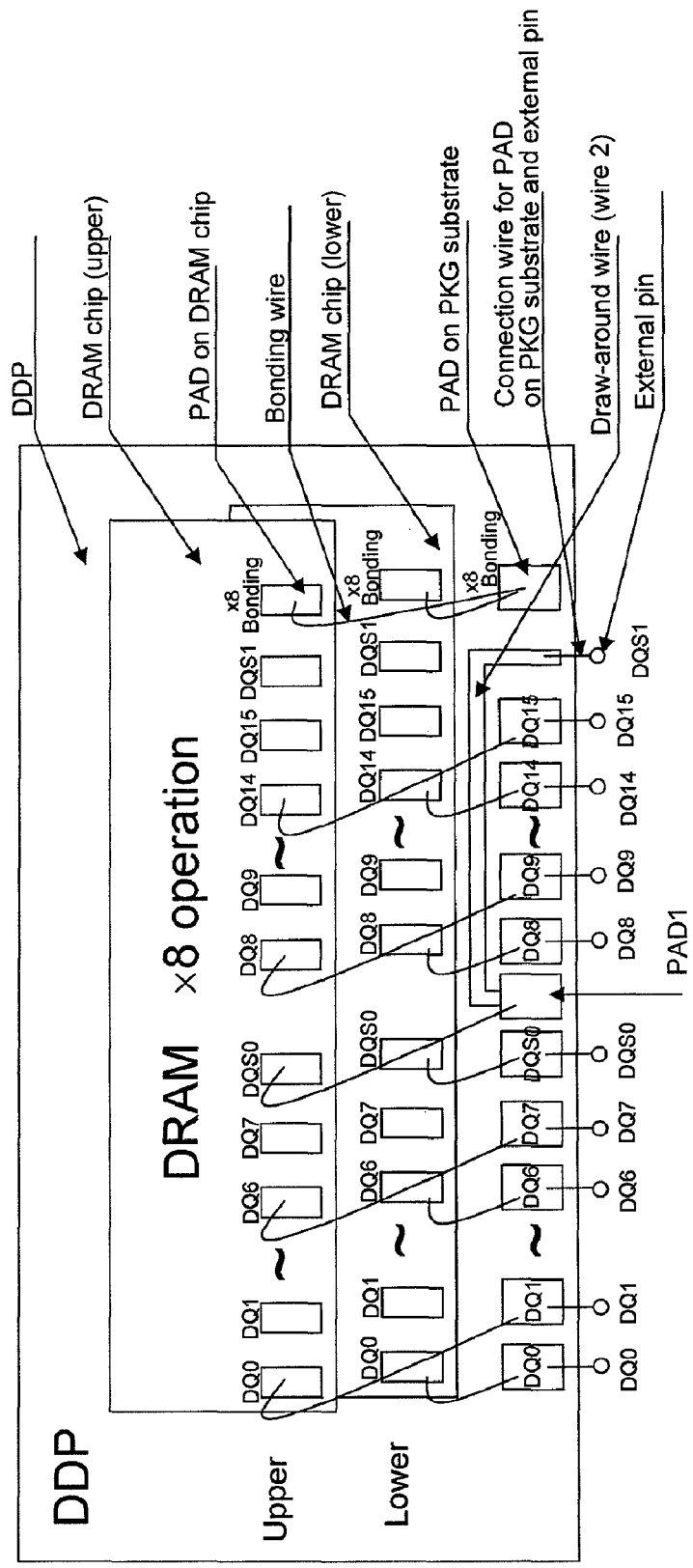
FIG. 2B is a diagram showing a bonding configuration of a related semiconductor module having the DDP structure.
Figure 3:
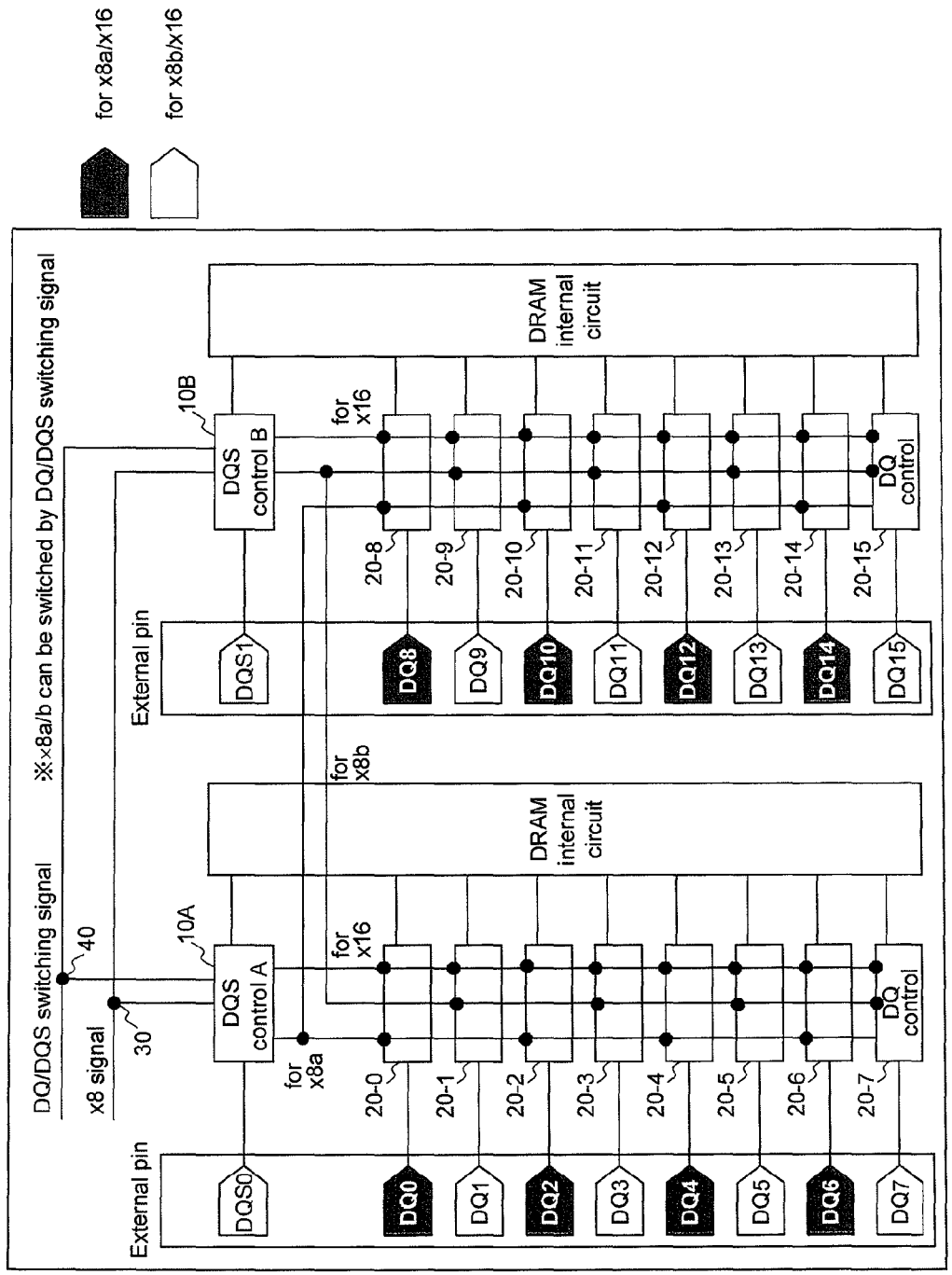
FIG. 3 is a circuit diagram of a DRAM mounted on a semiconductor module according to an exemplary embodiment of the present invention.

Each of the upper and lower DRAMs mounted on the semiconductor module according to this exemplary embodiment includes, as shown in FIG. 3, DQS control circuit 10A provided to correspond to a DQS0 pin on the PKG substrate, DQS control circuit 10B provided to correspond to a DQS1 pin on the PKG substrate, DQ control circuits 20-0~20-15 provided to correspond to DQ0~DQ15 pins on the PKG substrate, and input terminals 30 and 40.

Input terminal 30 is a word structure designation terminal to which ×8 signal (a word structure designation signal) for instructing switching from the ×16 operation to the ×8 operation is input. The input terminal 40 is a switching terminal to which a DQ/DQS switching signal (a first or second control signal) that indicates, as a DQ pin to which a DQ signal is input and from which the DQ signal is output during the ×8 operation, an EVEN side (an ordinally even-numbered) DQ pin or an ODD side (an ordinally odd-numbered) DQ pin is input.

DQ control circuits 20-0~20-15 include DQ control circuits 20-0, 20-2, 20-4, 20-6, 20-8, 20-10, 20-12, and 20-14 provided to correspond to the DQ0, DQ2, DQ4, DQ6, DQ8, DQ10, DQ12, and DQ14 pins on the EVEN side and connected to DQS control circuit 10A via a signal line for a signal for ×8a operation and DQ control circuits 20-1, 20-3, 20-5, 20-7, 20-9, 20-11, 20-13, and 20-15 provided to correspond to the DQ1, DQ3, DQS, DQ7, DQ9, DQ11, DQ13, and DQ15 pins on the ODD side and connected to DQS control circuit 10B via a signal line for a signal for ×8b operation.

DQ control circuits 20-0~20-15 include DQ control circuits 20-0~20-7 connected to DQS control circuit 10A via a signal line for a signal for ×16 operation and provided to correspond to higher-order DQ0~DQ7 pins and DQ control circuits 20-8~20-15 connected to DQS control circuit 10B via the signal line for the signal for ×16 operation and provided to correspond to lower-order DQ8~DQ15 pins.

During the ×16 operation (when the ×8 signal indicates Disable), DQS control circuit 10A supplies a signal supplied to the DQS0 pin to the signal line for the signal for ×16 operation, whereby DQ control circuits 20-0~20-7 corresponding to the higher-order DQ0~DQ7 pins are controlled by the signal (a strobe signal) supplied to the DQS0 pin.

During the ×8 operation (when the ×8 signal indicates Enable), when a DQ/DQS switching signal indicates Disable (a first control signal), DQS control circuit 10A supplies the signal supplied to the DQS0 pin to the signal line for the signal for ×8a operation, whereby DQ control circuits 20-0, 20-2, 20-4, 20-6, 20-8, 20-10, 20-12, and 20-14 provided to correspond to the DQ0, DQ2, DQ4, DQ6, DQ8, DQ10, DQ12, and DQ14 pins on the EVEN side are controlled by the signal supplied to the DQS0 pin.

On the other hand, during the ×16 operation (when the ×8 signal indicates Disable), DQS control circuit 10B supplies a signal supplied to the DQS1 pin to the signal line for the signal for ×16 operation, whereby DQ control circuits 20-8~20-15 are controlled by the signal supplied to the DQS1 pin.

During the ×8 operation (when the ×8 signal indicates Enable), when the DQ/DQS switching signal indicates Enable (a second control signal), DQS control circuit 10B supplies the signal supplied to the DQS1 pin to the signal line for the signal for ×8b operation, whereby DQ control circuits 20-1, 20-3, 20-5, 20-7, 20-9, 20-11, 20-13, and 20-15 provided to correspond to the DQ1, DQ3, DQS, DQ7, DQ9, DQ11, DQ13, and DQ15 pins on the ODD side are controlled by the signal supplied to the DQS1 pin.

DQ control circuits 20-0~20-15 performs OR operation the signal for ×16 operation, the signal for ×8a operation, and the signal for ×8b operation on the inside thereof. In a state in which the signal supplied to the DQS0 pin or the DQS1 pin is supplied via DQS control circuit 10A or DQS control circuit 10B, DQ control circuits 20-0~20-15 input and output the DQ signal via the DQ pins corresponding thereto according to the supplied DQS signal. In DQ control circuits 20-0~20-15, the signal for ×16 operation, the signal for ×8a operation, and the signal for ×8b operation are fixed at low (L) in a state in which the signal from the DQS0 pin or the DQS1 pin is not supplied to the signal lines.

Although not shown in the figure, in the DRAM shown in FIG. 3, data input/output terminals are respectively provided in connecting portions to the DQ0~DQ15 pins. Among the data input/output terminals, the data input/output terminals connected to the DQ0, DQ2, DQ4, DQ6, DQ8, DQ10, DQ12, and DQ14 pins on the EVEN side are first data input/output terminals. The data input/output terminals connected to the DQ1, DQ3, DQS, DQ7, DQ9, DQ11, DQ13, and DQ15 pins on the ODD side are second data input/output terminals. A first strobe terminal is provided in a connecting portion to the DQS0 pin. A second strobe terminal is provided in a connecting portion to the DQS1 pin.

As regards operations of the DRAM, there are three operations (1)~(3) explained below. These operations are explained in detail.

(1) ×16 operation (the DRAM is one chip)
(2) ×8 operation that is the operation of a DRAM chip on the EVEN side of mounted two DRAM chips: ×8a operation (×8 operation for inputting and outputting the DQ signal via the DQ0, DQ2, DQ4, DQ6, DQ8, DQ10, DQ12, and DQ14 pins on the EVEN side)
(3) ×8 operation that is the operation of the DRAM chip on the ODD side of the mounted two DRAM chips: ×8b operation (×8 operation for inputting and outputting the DQ signal via the DQ1, DQ3, DQS, DQ7, DQ9, DQ11, DQ13, and DQ15 pins on the ODD side)

The three operations (1)~(3) are explained below.

(1) ×16 Operation

When the ×8 signal indicates Disable, DQS control circuit 10A supplies the DQS signal supplied to the DQS0 pin to the signal line for the signal for ×16 operation. DQS control circuit 10B supplies the DQS signal supplied to the DQS1 pin to the signal line for the signal for ×16 operation.

At this point, DQ control circuits 20-0~20-7 corresponding to the DQ0 DQ7 pins are actuated by the DQS signal input from the DQS0 pin. DQ control circuits 20-8~20-15 corresponding to the DQ8~DQ15 pins are actuated by the DQS signal input from the DQS1 pin. Consequently, the ×16 operation for inputting and outputting sixteen DQ signals of one DRAM chip via all the DQ0~DQ15 pins is performed.

(2) ×8a Operation

When the ×8 signal indicates Enable and the DQ/DQS switching signal indicates Disable, DQS control circuit 10A supplies the DQS signal supplied to the DQS0 pin to the signal line for the signal for ×8a operation.

Consequently, DQ control circuits 20-0, 20-2, 20-4, 20-6, 20-8, 20-10, 20-12, and 20-14 corresponding to the DQ0, DQ2, DQ4, DQ8, DQ10, DQ12, and DQ14 pins on the EVEN side can be actuated by the DQS signal input from the DQS0 pin. At this point, since the signal for ×16 operation and the signal for ×8b operation are fixed at L, DQ control circuits 20-1, 20-3, 20-5, 20-7, 20-9, 20-11, 20-13, and 20-15 corresponding to the DQ1, DQ3, DQ5, DQ7, DQ9, DQ11, DQ13, and DQ15 pins on the ODD side are disabled.

Therefore, the DRAM chip on the EVEN side of the two DRAM chips performs, according to the DQS signal input from the DQS0 pin, the ×8 operation for inputting and outputting the DQ signal via the DQ0, DQ2, DQ4, DQ6, DQ8, DQ10, DQ12, and DQ14 pins on the EVEN side.

(3) ×8b Operation

When the ×8 signal indicates Enable and the DQ/DQS switching signal indicates Enable, DQS control circuit 10B supplies the DQS signal supplied to the DQS1 pin to the signal line for the signal for ×8b operation.

Consequently, DQ control circuits 20-1, 20-3, 20-5, 20-7, 20-9, 20-11, 20-13, and 20-15 corresponding to the DQ1, DQ3, DQ5, DQ7, DQ9, DQ11, DQ13, and DQ15 pins on the ODD side can be actuated by the DQS signal input from the DQS1 pin. At this point, since the signal for ×16 operation and the signal for ×8a operation are fixed at L, DQ control circuit 20-0, 20-2, 20-4, 20-6, 20-8, 20-10, 20-12, and 20-14 corresponding to the DQ0, DQ2, DQ4, DQ6, DQ8, DQ10, DQ12, and DQ14 pins on the EVEN side are disabled.

Therefore, the DRAM chip on the ODD side of the two DRAM chips performs, according to the DQS signal input from the DQS1 pin, the ×8 operation for inputting and outputting the DQ signal via the DQ1, DQ3, DQ5, DQ7, DQ9, DQ11, DQ13, and DQ15 pins on the ODD side.

In this way, the DQ signal of the DQ0~DQ7 pins is controlled by the DQS signal from the DQS0 pin and the DQ signal of the DQ8~DQ15 pins is controlled by the DQS signal from the DQS1 pin during the ×16 operation of (1).

On the other hand, switching is performed such that the DQ signal of the DQ pins on the EVEN side is controlled by the DQS signal from the DQS0 pin during the ×8 operation of (2) and the DQ signal of the DQ pins on the ODD side is controlled by the DQS signal from the DQS1 pin during the ×8 operation of (3).

Figure 4:
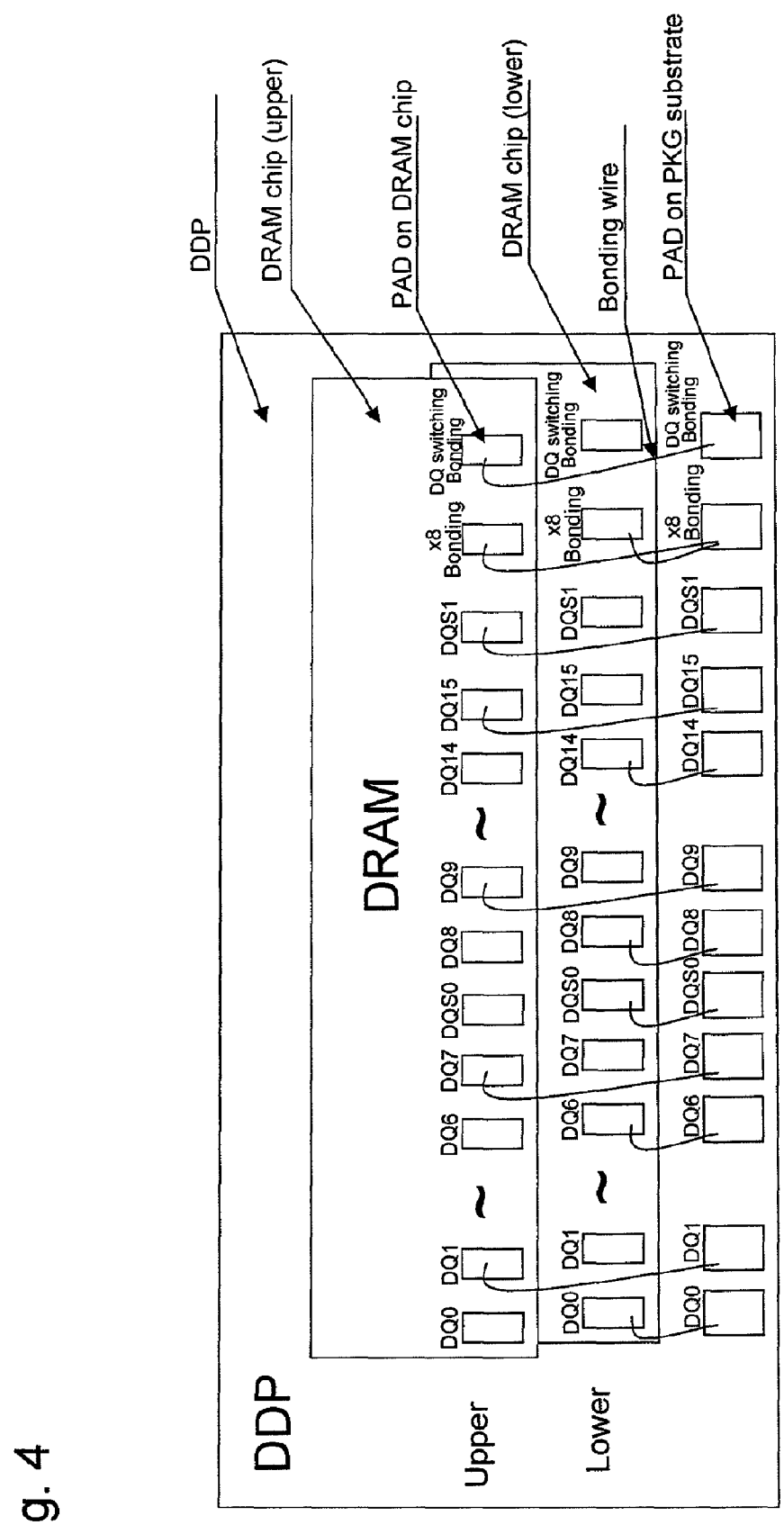
FIG. 4 is a diagram showing a bonding relation of the semiconductor module according to the exemplary embodiment of the present invention.

A bonding configuration of the semiconductor module having the DDP structure in which the two DRAM chips are stacked on the PKG substrate shown in FIG. 3 is shown in FIG. 4.

As shown in FIG. 4, a setting of the DQ/DQS signal is a bonding option. In FIG. 4, a DQ switching pad on the upper DRAM of the upper and lower DRAMs is bonded to a DQ switching pad on the PKG substrate to enable the DQ/DQS switching signal. This enables the upper DRAM to perform the ×8a operation and the lower DRAM to perform the ×8b operation.

As explained above, in this exemplary embodiment, not only the word structure designation signal for instructing switching from the ×16 operation to the ×8 operation but also the switching signal for switching the DQ pin that inputs and outputs the DQ signal during the ×8 operation is input to each of the upper and lower DRAMs. The ×8a operation for inputting and outputting the DQ signal via the DQ pins on the EVEN side according to the DQS signal from the DQS0 pin and the ×8b operation for inputting and outputting the DQ signal via the DQ pins on the ODD side according to the DQS signal from the DQS1 pin can be switched.

Therefore, it is possible to cause the lower DRAM to perform the ×8a operation according to the DQS signal from the DQS0 pin and cause the upper DRAM to perform the ×8b operation according to the DQS signal from the DQS1 pin.

Therefore, unlike the related art, since both the upper and lower DRAMs do not need to use the DQS0 pad, it is unnecessary to extend a wire to the DQS1 pin on the PKG substrate.

Consequently, there is an effect in which, in both the upper and lower DRAMs, the signal paths between the DRAMs and the PKG substrate can be set to substantially equal lengths for the DQ signal and the DQS signal.

In this exemplary embodiment, the DRAMs are explained as performing the ×16 operation and the ×8 operation. However, the present invention is not limited to this as long as DRAMs perform ×2N operation and ×N operation when N is an integer equal to or larger than 1 and operate using plural DQSs in performing the ×2N operation and using half as many DQSs as the plural DQSs in performing the ×N operation.

As DQS control circuits 10A and 10B, the DQS control circuits that supply signals supplied to the DQS0 and DQS1 pins to the signal lines corresponding thereto are explained. However, DQS control circuits 10A and 10B may supply the DQSs to the corresponding signal lines after amplifying the DQSs again or after shaping waveforms of the DQSs.

It is apparent that the present invention is not limited to the above embodiments, but may be modified and changed without departing from the scope and spirit of the invention.

What is claimed is:

1. A semiconductor device comprising:
a first data input/output terminal;
a second data input/output terminal;
a first strobe terminal that is provided to correspond to the first data input/output terminal and to which a first strobe signal is supplied;
a second strobe terminal that is provided to correspond to the second data input/output terminal and to which a second strobe signal is supplied; and
a control circuit that performs, when a first word structure is designated, control such that input and output of data is performed from the first data input/output terminal and from the second data input/output terminal in response to the first strobe signal and the second strobe signal, performs, when a second word structure is designated and when a first control signal is supplied, control such that input and output of data is performed from the first data input/output terminal in response to the first strobe signal, and performs, when the second word structure is designated and when a second control signal is supplied, control such that input and output of data is performed from the second data input/output terminal in response to the second strobe signal.

2. The semiconductor device according to claim 1, wherein the semiconductor device includes a plurality of the first data input/output terminals and a plurality of the second data input/output terminals, and
a number of the first data input/output terminals and a number of the second data input/output terminals are the same.

3. The semiconductor device according to claim 1, further comprising a word structure designation terminal for designating the first word structure and the second word structure.

4. The semiconductor device according to claim 1, further comprising a switching terminal for supplying the first control signal and the second control signal.

5. A semiconductor module comprising:
a substrate; and
two semiconductor devices that are stacked on the substrate and that input and output a DQ signal according to a DQS signal, wherein
the substrate includes:
N (N is an even natural number) DQ pins to which the DQ signal is input and from which the DQ signal is output; and
first and second DQS pins to which the DQS signal is input, and
each of the two semiconductor devices includes:
a word structure designation terminal to which a word structure designation signal for instructing switching from ×N operation to ×M (M=N/2) operation is input;
a DQ/DQS switching terminal to which a DQ/DQS switching signal that indicates, as a DQ pin to which the DQ signal is input and from which the DQ signal is output during the ×M operation, an ordinally even-numbered DQ pin or an ordinally odd-numbered DQ pin among the N DQ pins;
N DQ control circuits that are provided to correspond to the N DQ pins and, when the DQS signal is supplied via the first or second DQS pin, input and output the DQ signal via a DQ pin corresponding to the DQS pin according to the supplied DQS signal;

a first DQS control circuit that is provided to correspond to the first DQS pin and, when the DQ/DQS switching signal indicates the ordinally even-numbered DQ pin during the ×M operation, supplies the DQS signal, supplied to the first DQS pin, to the DQ control circuit corresponding to the ordinally even-numbered DQ pin; and a second DQS control circuit that is provided to correspond to the second DQS pin and, when the DQ/DQS switching signal indicates the ordinally odd-numbered DQ pin during the ×M operation, supplies the DQS signal, supplied to the second DQS pin, to the DQ control circuit corresponding to the ordinally odd-numbered DQ pin.

6. The semiconductor module according to claim 5, wherein the first DQS control circuit supplies the DQS signal, supplied to the first DQS pin, to the DQ control circuits corresponding to higher-order M DQ pins among the N DQ pins during the ×N operation, and the second DQS control circuit supplies the DQS signal, supplied to the second DQS pin, to the DQ control circuits corresponding to lower-order M DQ pins among the N DQ pins during the ×N operation.

* * * * *